(12) United States Patent
Cao

(10) Patent No.: US 8,493,156 B2
(45) Date of Patent: Jul. 23, 2013

(54) HIGH AMPLITUDE VOLTAGE-CONTROLLED OSCILLATOR WITH DYNAMIC BIAS CIRCUIT

(75) Inventor: Zhiheng Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 29 days.

(21) Appl. No.: 13/154,314

(22) Filed: Jun. 6, 2011

(65) Prior Publication Data

US 2012/0306584 A1      Dec. 6, 2012

(51) Int. Cl.
*H03B 5/12*      (2006.01)
*H03L 5/00*      (2006.01)

(52) U.S. Cl.
USPC ............... 331/117 FE; 331/173; 331/183; 331/185

(58) Field of Classification Search
USPC ............ 331/117 FE, 117 R, 167, 172, 173, 331/182, 183, 185, 186
See application file for complete search history.

(56) References Cited

U.S. PATENT DOCUMENTS

| | | | |
|---|---|---|---|
| 6,064,277 A * | 5/2000 | Gilbert | 331/117 R |
| 6,653,908 B1 * | 11/2003 | Jones | 331/183 |
| 6,680,655 B2 * | 1/2004 | Rogers | 331/109 |
| 6,750,726 B1 * | 6/2004 | Hung et al. | 331/100 |
| 6,909,336 B1 * | 6/2005 | Rajagopalan et al. | 331/183 |
| 6,963,252 B2 * | 11/2005 | Kasperkovitz | 331/108 B |
| 7,075,377 B2 * | 7/2006 | Metaxakis | 331/46 |
| 7,196,592 B2 * | 3/2007 | Shi et al. | 331/117 FE |

* cited by examiner

*Primary Examiner* — Levi Gannon
(74) *Attorney, Agent, or Firm* — Farjami & Farjami LLP

(57) ABSTRACT

According to an exemplary embodiment, a high amplitude oscillation generator includes an LC tank circuit, a gain stage, a dynamic bias circuit, a bias current source, and a dynamic bias circuit receiving a current source feedback voltage and outputting a gain stage bias voltage. The dynamic bias circuit adjusts the gain stage bias voltage in response to a change in the current source feedback voltage after a start up of the LC tank circuit. The dynamic bias circuit thereby increases an amplitude of oscillations produced by the oscillation generator. The dynamic bias circuit can include an error amplifier, the error amplifier generating the gain stage bias voltage responsive to the current source feedback voltage. The current source feedback voltage can change with a voltage drop across the bias current source. The current source feedback voltage can also be received from an output of the oscillation generator.

19 Claims, 3 Drawing Sheets

HIGH AMPLITUDE VOLTAGE-CONTROLLED OSCILLATOR WITH DYNAMIC BIAS CIRCUIT

BACKGROUND OF THE INVENTION

1. Field of the Invention

The present invention is generally in the field of electrical circuits and systems. More particularly, the invention relates to circuits for generating oscillating signals.

2. Background Art

Oscillation generators generate an oscillating signal, which can be used in various electronic circuits. For example, voltage-controlled oscillators (VCOs) and the like are commonly included in radio-frequency (RF) modules to generate an oscillating signal. A VCO can include a tank circuit (e.g., an LC circuit) and a gain stage for generating and amplifying the oscillating signal. The gain stage typically includes output transistors to supply a bias current from a bias current source to the tank circuit. It is desirable to implement the RF module using advanced complementary metal-oxide-semiconductor (CMOS) processes. For example, by using both PMOS and NMOS output transistors, a CMOS VCO, such as a CMOS complementary VCO (i.e. a CMOS VCO based on a complementary cross-coupled structure), can generate an oscillating signal with the same amplitude as an NMOS-only LC-VCO using half as much bias current.

However, the bias current source and the gain stage of the oscillation generator require voltage headroom for start up so as to reliably start generating the oscillating signal with the tank circuit. Furthermore, the bias current source and the gain stage require voltage headroom to ensure that they operate in saturation mode in order to maintain good supply rejection. These voltages introduce challenges when implementing the VCO with a low supply voltage. For example, while a low voltage supply, such as 1.2 volts, may be sufficient to satisfy voltage headroom requirements to start up a tank circuit of an NMOS-only LC-VCO, the gain stage of a CMOS complementary VCO may require a higher supply voltage to start up due to having additional output transistors in its gain stage. It has been contemplated that a static bias voltage could be applied to gates of output transistors in the gain stage of the CMOS complementary VCO to provide sufficient voltage headroom for start up of its tank circuit. However, the static bias voltage would undesirably reduce an amplitude of oscillations produced by the CMOS complementary VCO. Among other disadvantages, this increases phase noise of the oscillating signal.

Thus, it would be desirable in the art to provide oscillation generators that can satisfy voltage headroom requirements for startup of a tank circuit without reducing an amplitude of oscillations produced by the oscillation generator.

SUMMARY OF THE INVENTION

A high amplitude voltage-controlled oscillator with dynamic bias circuit, substantially as shown in and/or described in connection with at least one of the figures, and as set forth more completely in the claims.

DETAILED DESCRIPTION OF THE INVENTION

The present invention is directed to a high amplitude voltage-controlled oscillator with dynamic bias circuit. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Figure 1:
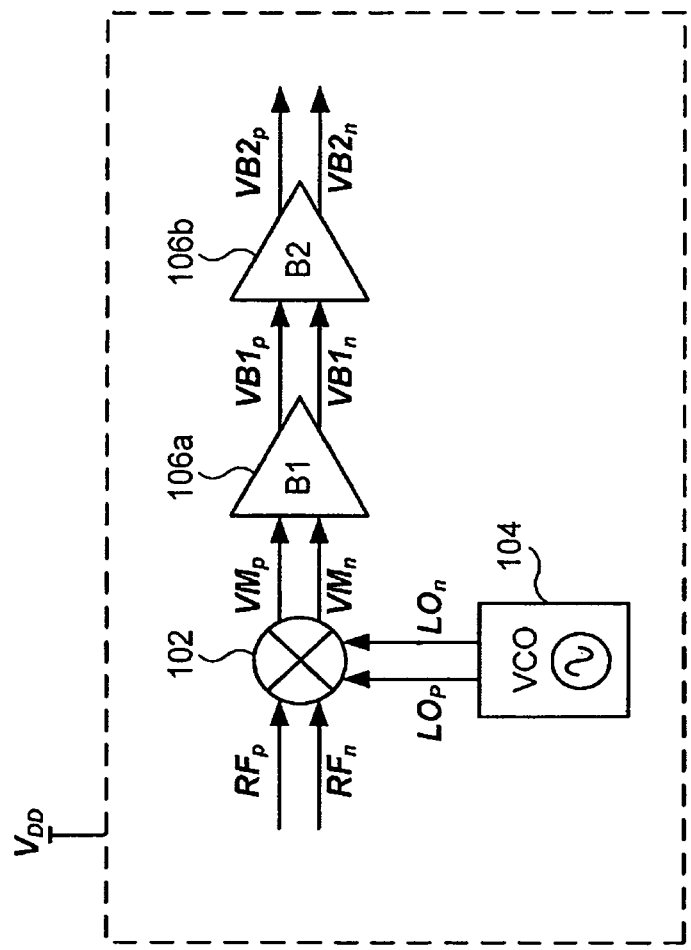
FIG. 1 illustrates an exemplary radio frequency (RF) module, according to one embodiment of the invention.

FIG. 1 illustrates radio frequency (RF) module 100, according to one embodiment of the invention. RF module 100 includes mixer 102, voltage-controlled oscillator (VCO) 104, and buffer stages 106a and 106b, which are powered by a common supply voltage, supply voltage $V_{DD}$.

VCO 104 and buffer stages 106a and 106b are oscillation generators for generating an oscillating signal. As shown in FIG. 1, mixer 102 receives differential signal RF as an inputs $RF_p$ and $RF_n$ and differential signal LO as inputs $LO_p$ and $LO_n$. Mixer 102 also has differential signal VM as outputs $VM_p$ and $VM_n$. Buffer stage 106a receives differential signal VM as inputs $VM_p$ and $VM_n$ and differential signal VB1 as outputs $VB1_p$ and $VB1_n$. Buffer stage 106b receives differential signal VB1 as inputs $VB1_p$ and $VB1_n$ and differential signal VB2 as outputs $VB2_p$ and $VB2_n$. In RF module 100, buffer stages 106a and 106b are optional and amplify differential signal VM from mixer 102. It will be appreciated that more or fewer buffer stages can be included in RF module 100.

In the present embodiment, RF module 100 can take advantage of advanced CMOS processes. For example, mixer 102 is a CMOS Gilbert cell mixer, VCO 104 is a CMOS complementary VCO, and buffer stages 106a and 106b are CMOS buffer stages. Thus, differential signals LO, VM, VB1, and VB2, for example, can be generated with supply voltage $V_{DD}$ using much less bias current than NMOS-only circuits. Thus, RF module 100 would be beneficial to, as specific examples, achieve low Bluetooth receiver current as well as GPS radio current.

Conventionally, supply voltage $V_{DD}$ is too low to satisfy voltage headroom requirements to start up a tank circuit of an oscillation generator in RF module 100. For example, supply voltage $V_{DD}$ is conventionally too low to satisfy voltage headroom requirements to start up a tank circuit of VCO 104. In accordance with various embodiments of the present invention, supply voltage $V_{DD}$ is sufficient to satisfy voltage headroom requirements to start up the tank circuit of VCO 104. Furthermore, supply voltage $V_{DD}$ is sufficient to satisfy voltage headroom requirements to start up the tank circuit of VCO 104 wile increasing an amplitude of differential signal LO produced by VCO 104. Thus, VCO 104 can be a high amplitude oscillation generator.

Although embodiments of the present invention are described with respect to VCO 104, it will be appreciated that these embodiments similarly apply to other circuits, such as buffer stages 106a and 106b, as will be more apparent from the description below.

Figure 2:
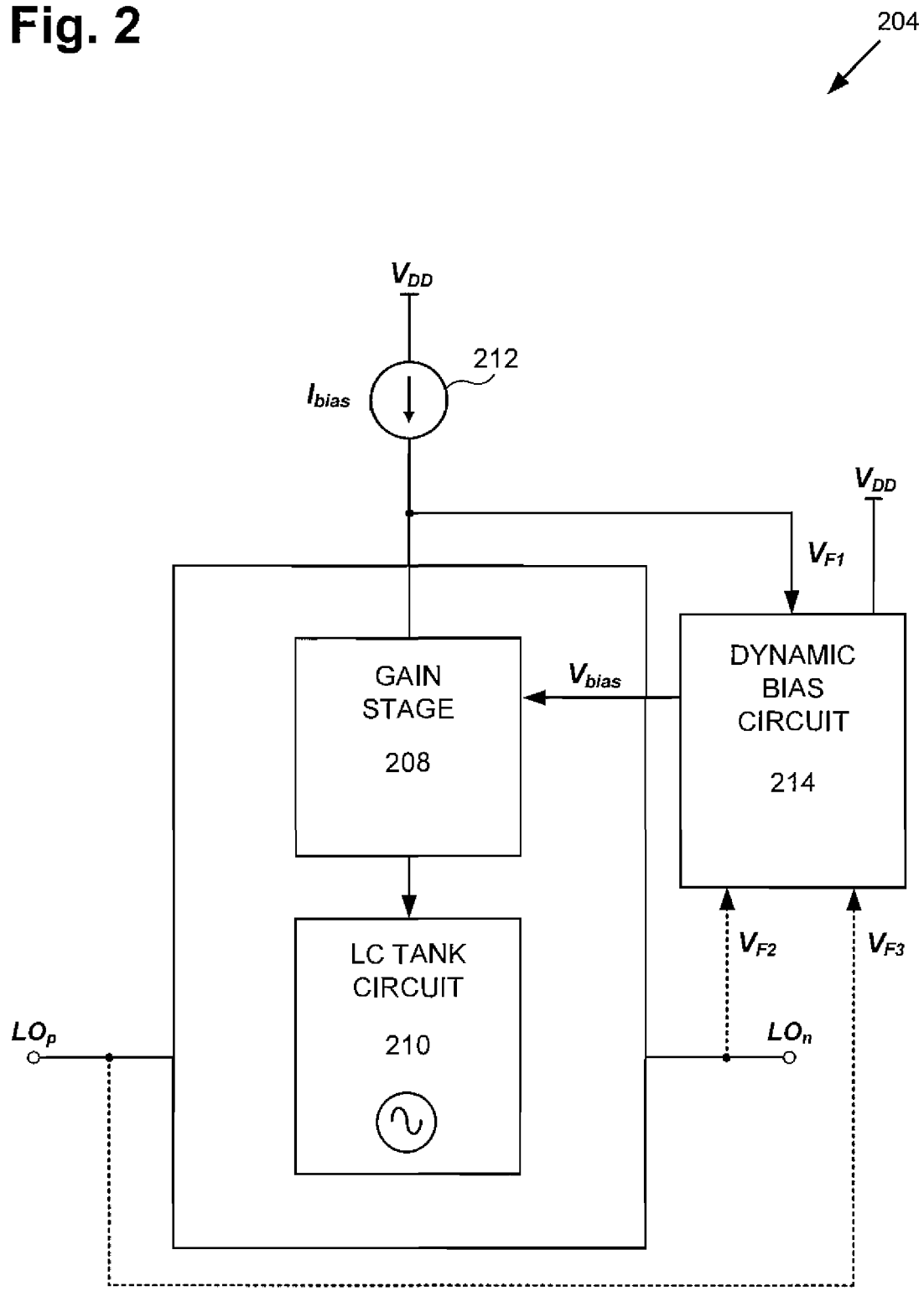
FIG. 2 illustrates an exemplary oscillation generator, according to one embodiment of the invention.

Referring now to FIG. 2, FIG. 2 illustrates an exemplary oscillation generator, and more particularly VCO 204, according to one embodiment of the invention. VCO 204 corresponds to VCO 104 in FIG. 1. Thus, in FIG. 2, VCO 204 includes differential signal LO as outputs $LO_p$ and $LO_n$, which corresponds to differential signal LO in FIG. 1. Similarly, supply voltage $V_{DD}$ in FIG. 2 corresponds to supply voltage $V_{DD}$ in FIG. 1.

VCO 204 includes gain stage 208, LC tank circuit 210, and bias current source 212 (also referred to herein as "current source 212"). In the present embodiment, current source 212 is a "tail current source." Current source 212 supplies bias current $I_{bias}$ to gain stage 208. Gain stage 208 applies bias current $I_{bias}$ to LC tank circuit 210 such that LC tank circuit 210 can start up to generate differential signal LO. Furthermore, current source 212 supplies bias current $I_{bias}$ to gain stage 208 to amplify an amplitude of oscillations produced by VCO 204 (to amplify differential signal LO).

In the present embodiment, VCO 204 is a CMOS complementary VCO and supply voltage $V_{DD}$ is a low supply voltage at 1.2 volts. While 1.2 volts may be sufficient to satisfy voltage headroom requirements to start up a tank circuit of an NMOS-only VCO, gain stage 208 of VCO 204 requires a higher supply voltage to start up LC tank circuit 210. This is because gain stage 208 includes additional output transistors, which are not necessarily present in an NMOS-only VCO, which increase a voltage drop required by gain stage 208. As such, conventionally supply voltage $V_{DD}$ may not allow for a sufficient voltage drop $V_{DD}$-$V_{F1}$ across current source 212 for start up of LC tank circuit 210. Thus, conventionally supply voltage $V_{DD}$ is too low to satisfy voltage headroom requirements to start up LC tank circuit 210.

However, VCO 204 includes gain stage bias voltage $V_{bias}$, which advantageously allows supply voltage $V_{DD}$ to satisfy voltage headroom requirements to start up LC tank circuit 210 by reducing the voltage drop required by gain stage 208. Thus, gain stage bias voltage $V_{bias}$ can ensure that voltage drop $V_{DD}$-$V_{F1}$ across current source 212 is sufficient for start up of LC tank circuit 210 even where supply voltage $V_{DD}$ is a low supply voltage, such as 1.2 volts.

It has been contemplated that gain stage bias voltage $V_{bias}$ be a static bias voltage. While the static bias voltage would allow for start up of LC tank circuit 210, this would reduce an amplitude of differential output LO after start up and thereby increase phase noise. After start up of LC tank circuit 210, the voltage drop required by gain stage 208 is significantly reduced because LC tank circuit 210 oscillating. Thus, the impact of gain stage bias voltage $V_{bias}$ can be reduced after start up thereby increasing an amplitude of differential output LO after start up.

In accordance with the present embodiment, VCO 204 includes dynamic bias circuit 214 receiving current source feedback voltage $V_{F1}$ and outputting gain stage bias voltage $V_{bias}$. Dynamic bias circuit 214 adjusts gain stage bias voltage $V_{bias}$ in response to a change in current source feedback voltage $V_{F1}$ after start up of LC tank circuit 210. By, adjusting gain stage bias voltage $V_{bias}$ in response to a change in current source feedback voltage $V_{F1}$ after start up of LC tank circuit 210, dynamic bias circuit 214 can increase an amplitude of oscillations produced by VCO 204. This is accomplished by reducing the impact of gain stage bias voltage $V_{bias}$ after start up of LC tank circuit 210.

In the present embodiment, dynamic bias circuit 214 utilizes current source feedback voltage $V_{F1}$ to adjust gain stage bias voltage $V_{bias}$. Current source feedback voltage $V_{F1}$ changes with voltage drop $V_{DD}$-$V_{F1}$ across current source 212 to reflect changes in a voltage drop required by gain stage 208. For example, in the present embodiment, after start up of LC tank circuit 210, current source feedback voltage $V_{F1}$ will decrease to reflect a reduced voltage drop required by gain stage 208. Thus, in one embodiment, dynamic bias circuit 214 can adjust gain stage bias voltage $V_{bias}$ when current source feedback voltage $V_{F1}$ reaches or exceeds a particular value that indicates start up of LC tank circuit 210 has occurred. In other embodiments, dynamic bias circuit 214 can adjust gain stage bias voltage $V_{bias}$ continuously along with current source feedback voltage $V_{F1}$, as is described with respect to FIG. 3. Dynamic bias circuit 214 can adjust gain stage bias voltage $V_{bias}$ to be at or near 0 volts after start up LC tank circuit 210, as one example. In some embodiments, after dynamic bias circuit 214 adjusts gain stage bias voltage $V_{bias}$, gain stage bias voltage $V_{bias}$ can remain static thereafter while VCO 204 is generating differential signal LO. In other embodiments, after dynamic bias circuit 214 adjusts gain stage bias voltage $V_{bias}$, gain stage bias voltage $V_{bias}$ can be further adjusted by dynamic bias circuit 214.

Thus, as described above, dynamic bias circuit 214 can adjust gain stage bias voltage $V_{bias}$ in response to a change in current source feedback voltage $V_{F1}$ after start up of LC tank circuit 210. Current source feedback voltage $V_{F1}$ corresponds to a drain terminal of current source 212 in the present embodiment. It will be appreciated that dynamic bias circuit 214 can adjust gain stage bias voltage $V_{bias}$ after start up of LC tank circuit 210 in response a change in other current source feedback voltages in addition to or instead of current source feedback voltage $V_{F1}$. For example, dynamic bias circuit 214 can optionally adjust gain stage bias voltage $V_{bias}$ utilizing any of current source feedback voltages $V_{F2}$ and $V_{F3}$ in addition to or instead of current source feedback voltage $V_{F1}$. Current source feedback voltage $V_{F2}$ is from output $LO_n$ of VCO 204 and current source feedback voltage $V_{F3}$ is from output $LO_p$ of VCO 204. Thus, dynamic bias circuit 214 can be connected to outputs $LO_p$ and $LO_n$ to receive current source feedback voltages $V_{F2}$ and $V_{F3}$. As such, in some embodiments, dynamic bias circuit 214 can, for example, adjust gain stage bias voltage $V_{bias}$ by detecting a change in an amplitude of differential signal LO. It is noted that current source feedback voltages $V_{F2}$ and $V_{F3}$ will change with voltage drop $V_{DD}$-$V_{F1}$ across bias current source 312.

Although embodiments of the present invention are described with respect to VCO 204, it will be appreciated that these embodiments similarly apply to other circuits, such as buffer stages 106a and 106b in FIG. 1. For example, buffer stage 106a can include a bias current source and a dynamic bias circuit to adjust a gain stage bias voltage similar to what has been described above. Thus, the performance of RF module 100 can be further enhanced.

Figure 3:
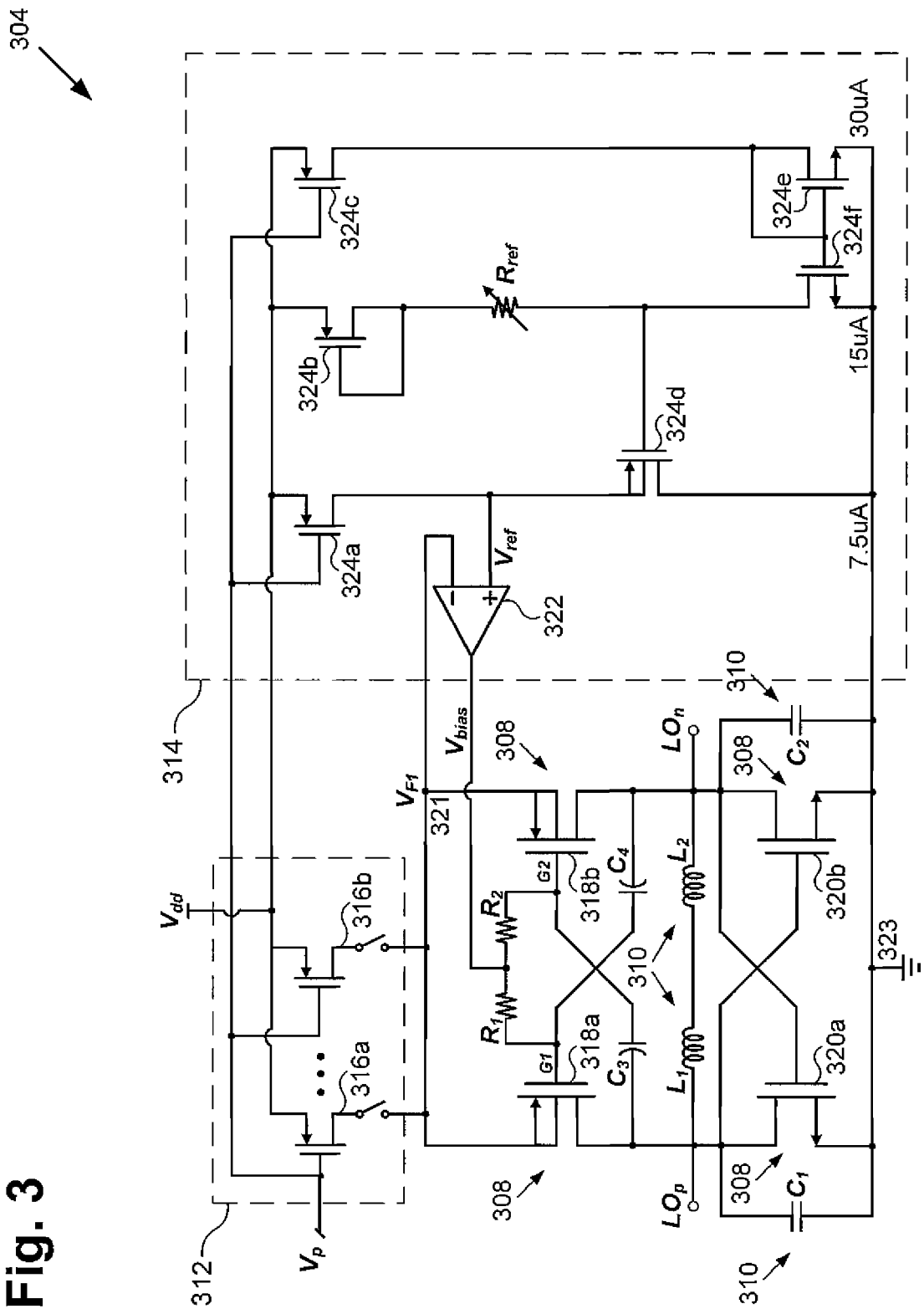
FIG. 3 illustrates an exemplary oscillation generator, according to one embodiment of the invention.

Turning to FIG. 3, FIG. 3 illustrates an exemplary oscillation generator, and more particularly VCO 304, according to one embodiment of the invention. VCO 304 corresponds to VCO 204 in FIG. 2. VCO 304 has differential signal LO as outputs $LO_p$ and $LO_n$, which corresponds to differential signal LO in FIG. 2. FIG. 3 also shows supply voltage $V_{DD}$ corresponding to supply voltage $V_{DD}$ in FIG. 2. VCO 304 also has gain stage 308, LC tank circuit 310, current source 312, and dynamic bias circuit 314 corresponding respectively to gain stage 208, LC tank circuit 210, current source 212, and dynamic bias circuit 214 in FIG. 2.

In the present embodiment, VCO 304 is a CMOS complementary VCO. Current source 312 is a P type current source comprising a plurality of P type transistors, such as transistors 316a and 316b. Current source 312 is a tail current source and is operated utilizing input $V_p$ in a manner known in the art. LC tank circuit 310 comprises capacitors $C_1$ and $C_2$ and inductors $L_1$ and $L_2$. Gain stage 308 is coupled to LC tank circuit 310 and includes output transistors 318a, 318b, 320a, and 320b. Output transistors 318a and 318b have a same conductivity type and are P type transistors (also referred to herein as output transistors 318). Output transistors 318 are cross-coupled with sources connected with sources connected at common node 321. Current source 312 is coupled to common node 321. Output transistors 320a and 320b also have a same conductivity type and are N type transistors (also referred to herein as output transistors 320). Output transistors 320 are cross-coupled with sources connected at common node 323. Common node 323 is coupled to ground. Thus, current source 312 is coupled between supply voltage $V_{DD}$ and common node 321 and gain stage 308 is coupled between current source 312 and ground.

As described above, supply voltage $V_{DD}$ is a low supply voltage at 1.2 volts. Conventionally supply voltage $V_{DD}$ would be too low to satisfy voltage headroom requirements to start up LC tank circuit 310. While 1.2 volts may be sufficient to satisfy voltage headroom requirements to start up an LC tank circuit with an NMOS-only VCO, gain stage 308 of VCO 304 requires a higher supply voltage to start up LC tank circuit 310. This is because gain stage 308 must account for four output transistors (output transistors 318 and 320) whereas an NMOS-only VCO only requires two output transistors. Thus, output transistors 318 and 320 cause an increased voltage drop to be required by gain stage 308. As such, conventionally supply voltage $V_{DD}$ does not allow for a sufficient voltage drop $V_{DD}$-$V_{F1}$ to start up LC tank across current source 312 for start up of LC tank circuit 310.

However, VCO 304 includes gain stage bias voltage $V_{bias}$, which advantageously allows supply voltage $V_{DD}$ to satisfy voltage headroom requirements to start up LC tank circuit 310. Gain stage bias voltage $V_{bias}$ is biasing gates G1 and G2 of output transistors 318. Thus, gain stage bias voltage $V_{bias}$ can reduce the voltage drop required by gain stage 308 to ensure that voltage drop $V_{DD}$-$V_{F1}$ across current source 312 is sufficient for start up of LC tank circuit 310 even where supply voltage $V_{DD}$ is a low supply voltage, such as 1.2 volts.

As shown in FIG. 3, in the present embodiment, gain stage bias voltage $V_{bias}$ is provided to gates G1 and G2 of output transistors 318 using low-pass RC filters comprising resistors $R_1$ and $R_2$ and capacitors $C_3$ and $C_4$. In other embodiments, gain stage bias voltage $V_{bias}$ is provided using a center-tapped secondary winding of a transformer or is be provided using other means.

It has been contemplated that gain stage bias voltage $V_{bias}$ be a static bias voltage. For example, in the present embodiment, where gain stage bias voltage $V_{bias}$ is biasing gates G1 and G2 of output transistors 318, which are P type, gain stage bias voltage $V_{bias}$ can be a negative voltage for start up of LC tank circuit 310. While the static bias voltage would allow for start up of LC tank circuit 310, it would also reduce the amplitude of differential output LO after start up and thereby increase phase noise.

In accordance with the present embodiment, VCO 304 includes dynamic bias circuit 314 for adjusting gain stage bias voltage $V_{bias}$ in response to a change in current source feedback voltage $V_{F1}$ after start up of LC tank circuit 310. By adjusting gain stage bias voltage $V_{bias}$ in response to a change in current source feedback voltage $V_{F1}$ after start up of LC tank circuit 310, dynamic bias circuit 314 can increase an amplitude of oscillations produced by VCO 304 by reducing the impact of gain stage bias voltage $V_{bias}$ on the amplitude of oscillations produced by VCO 340 after start up.

In the present example, after start up of LC tank circuit 310, the voltage drop required by gain stage 308 is significantly reduced because LC tank circuit 310 is oscillating. As such, current source feedback voltage $V_{F1}$ will decrease to reflect a reduced voltage drop required by gain stage 208. Thus, dynamic bias circuit 314 can increase gain stage bias voltage $V_{bias}$ to reduce its impact while maintaining sufficient voltage drop $V_{DD}$-$V_{F1}$ across current source 312 for proper operation. As such, output transistors 318 can have higher resistivity so that dynamic bias circuit 314 increases an amplitude of oscillations produced by VCO 340.

In the present embodiment, dynamic bias circuit 314 adjusts gain stage bias voltage $V_{bias}$ while ensuring that current source 312 operates in a saturation mode. Also in the present embodiment, dynamic bias circuit 314 adjusts gain stage bias voltage $V_{bias}$ while ensuring that output transistors 318 and 320 operate in a saturation mode. Thus, current source 312 and output transistors 318 and 320 can provide good supply rejection and VCO 304 can be a class-C VCO.

In the specific example shown, dynamic bias circuit 314 includes error amplifier 322, reference transistors 324a, 324b, 324c, 324d, 324e, and 324f (also referred to herein as reference transistors 324), and reference resistor $R_{ref}$. Error amplifier 322 generates gain stage bias voltage $V_{bias}$ responsive to current source feedback voltage $V_{F1}$. As shown in FIG. 3, error amplifier 322 generates gain stage bias voltage $V_{bias}$ from current source feedback voltage $V_{F1}$ and reference voltage $V_{ref}$. Error amplifier 322 has current source feedback voltage $V_{F1}$ connected to a negative input and reference voltage $V_{ref}$ connected to a positive input. Current source feedback voltage $V_{F1}$ corresponds to a drain voltage of current source 312 and common node 321 of output transistors 318. Thus, current source feedback voltage $V_{F1}$ changes with voltage drop $V_{DD}$-$V_{F1}$ across current source 312. Reference voltage $V_{ref}$ is generated using reference transistors 324 and reference resistor $R_{ref}$ and is generated from supply voltage $V_{DD}$. Thus, in the present embodiment, supply voltage $V_{DD}$ is a common supply voltage that powers current source 312 and dynamic bias circuit 314.

Dynamic bias circuit 314 utilizes a current mirroring approach for generating reference voltage $V_{ref}$ that will be readily apparent to one of ordinary skill in the art and should not be considered limiting. Therefore, the manner in which reference voltage $V_{ref}$ is generated will not be described in detail. As one specific example, in the present embodiment, reference transistors 324a, 324b, 324c, and 324d have respective relative widths M=5, M=6, M=20, and M=60. Reference transistors 324 are configured such that reference voltage $V_{ref}$ is sufficient to ensure that output transistors 318 operate in a saturation mode of operation even with process, temperature, and supply variation. Thus, dynamic bias circuit 314 can adjust gain stage bias voltage $V_{bias}$ to reduce its impact on gain stage 308 while ensuring that output transistors 318 and 320 operate in a saturation mode. Reference resistor $R_{ref}$ can be selected to provide some margin for gain stage bias voltage $V_{bias}$ as without reference resistor $R_{ref}$, dynamic bias circuit 314 will adjust gain stage bias voltage $V_{bias}$ to minimize its impact on gain stage 308 while ensuring that output transistors 318 and 320 operate in a saturation mode.

The present embodiments have been described with respect to a CMOS VCO, and more particularly a CMOS complementary VCO. However, it will be appreciated that the present invention is not limited to a CMOS complementary VCO and can be implemented in many different circuits, including buffer stages as described above. In one embodiment, VCO 304 is an NMOS-only VCO. In another embodiment, VCO 304 is a PMOS-only VCO. It is noted that in embodiments where gain stage bias voltage $V_{bias}$ is biasing gates of N type output transistors, gain stage bias voltage $V_{bias}$ can be a positive voltage for start up of LC tank circuit 310 and dynamic bias circuit 314 can decrease gain stage bias voltage $V_{bias}$ to reduce the impact of gain stage bias voltage $V_{bias}$ on an amplitude of oscillations produced by VCO 340.

Thus, as discussed above, in the embodiments of FIGS. 1 through 3, the present invention can provide for an oscillation generator that satisfies voltage headroom requirements for startup of a tank circuit without reducing an amplitude of oscillations produced by the oscillation generator. Various embodiments of the present invention include a dynamic bias circuit adjusting a gain stage bias voltage and thereby increasing an amplitude of oscillations produced by the oscillation generator. Thus, the oscillations produced by the oscillation generator can have low phase noise.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A high amplitude oscillation generator comprising:
   an LC tank circuit;
   a gain stage;
   a dynamic bias circuit;
   a bias current source;
   said dynamic bias circuit receiving a current source feedback voltage and outputting a gain stage bias voltage;
   said dynamic bias circuit adjusting said gain stage bias voltage to reduce a voltage drop across said gain stage during a start up of said LC tank circuit;
   said dynamic bias circuit adjusting said gain stage bias voltage in response to a change in said current source feedback voltage after a start up of said LC tank circuit, said dynamic bias circuit thereby increasing an amplitude of oscillations produced by said oscillation generator.

2. The oscillation generator of claim 1, wherein said current source feedback voltage changes with a voltage drop across said bias current source.

3. The oscillation generator of claim 1, wherein said current source feedback voltage is received from an output of said oscillation generator.

4. The oscillation generator of claim 1, wherein said dynamic bias circuit comprises an error amplifier, said error amplifier generating said gain stage bias voltage responsive to said current source feedback voltage.

5. The oscillation generator of claim 1, wherein said gain stage bias voltage biases gates of output transistors of said oscillation generator.

6. The oscillation generator of claim 1, wherein said gain stage bias voltage is adjusted while said current source operates in a saturation mode.

7. The oscillation generator of claim 1, wherein said gain stage bias voltage is adjusted while output transistors of said gain stage operate in a saturation mode.

8. The oscillation generator of claim 1, wherein a common supply voltage powers said bias current source and said dynamic bias circuit.

9. The oscillation generator of claim 1, wherein said bias current source supplies a bias current to said gain stage to amplify said amplitude of oscillations produced by said oscillation generator.

10. The oscillation generator of claim 1, wherein said bias current source is a tail current source.

11. A high amplitude voltage-controlled oscillator (VCO) comprising:
    an LC tank circuit;
    a gain stage;
    a dynamic bias circuit;
    a bias current source;
    said dynamic bias circuit including an error amplifier receiving a current source feedback voltage and a reference voltage from a reference circuit, and outputting a gain stage bias voltage;
    said dynamic bias circuit adjusting said gain stage bias voltage to reduce a voltage drop across said gain stage during a start up of said LC tank circuit;
    said error amplifier increasing said gain stage bias voltage in response to a decrease in said current source feedback voltage after a start up of said LC tank circuit, said error amplifier thereby increasing an amplitude of oscillations produced by said VCO.

12. The VCO of claim 11, wherein said current source feedback voltage changes with a voltage drop across said bias current source.

13. The VCO of claim 11, wherein said current source feedback voltage is received from an output of said VCO.

14. The VCO of claim 11, wherein said gain stage bias voltage biases gates of output transistors of said VCO.

15. The VCO of claim 11, wherein said gain stage bias voltage is adjusted while said current source operates in a saturation mode.

16. The VCO of claim 11, wherein said gain stage bias voltage is increased while output transistors of said gain stage operate in a saturation mode.

17. The VCO of claim 11, wherein a common supply voltage powers said bias current source and said dynamic bias circuit.

18. The VCO of claim 11, said gain stage comprises output transistors of a same conductivity type, said bias current source being coupled to a common node of said output transistors.

19. The VCO of claim 11, wherein said VCO is a CMOS complementary VCO.

* * * * *